United States Patent

Friedburg

Patent Number: 5,309,103
Date of Patent: May 3, 1994

[54] APPARATUS TO EXCITE AND/OR TO DETECT MAGNETIC RESONANCE

[75] Inventor: Helmut Friedburg, Waldbronn, Fed. Rep. of Germany

[73] Assignee: Bruker Medizintechnik GmbH, Fed. Rep. of Germany

[21] Appl. No.: 865,481

[22] Filed: Apr. 9, 1992

[30] Foreign Application Priority Data

Apr. 9, 1991 [DE] Fed. Rep. of Germany ....... 4111508

[51] Int. Cl.$^5$ .......................................... G01R 33/00
[52] U.S. Cl. ................................................. 324/318
[58] Field of Search ............. 324/300, 307, 309, 318, 324/322, 310, 311, 312, 313, 314

[56] References Cited

U.S. PATENT DOCUMENTS

| 5,138,261 | 8/1992 | Ratzel | 324/322 |
| 5,166,619 | 11/1992 | Ries | 324/322 |
| 5,208,537 | 5/1993 | Rietsch et al. | 324/322 |

FOREIGN PATENT DOCUMENTS

| 0307981A1 | 8/1988 | European Pat. Off. |
| 3445724A1 | 12/1984 | Fed. Rep. of Germany |
| 3445724A1 | 6/1985 | Fed. Rep. of Germany |

Primary Examiner—Michael J. Tokar
Attorney, Agent, or Firm—Cesari and McKenna

[57] ABSTRACT

An apparatus serves to excite and/or measure magnetic resonance in samples, in particular in relation to whole body tomography. A probehead (10) incorporates a high frequency system to transmit and/or to detect a high frequency magnetic field of a predetermined measuring frequency. The probehead (10) further incorporates a coil system to produce a magnetic field of predetermined inhomogeneity inside an inner space (13) of the probehead (10) varying according to a predetermined time program. Elements of the high frequency system are combined with elements of the coil system into common construction units. In addition, a signal processing unit for measured resonance signals is provided for. The construction units are in the form of hollow bodies (20). Coils (33) of the coil system are located inside the hollow bodies (20). Conductive outer walls (21) of the hollow bodies (20) form the high frequency system. The walls (21) exhibit a thickness (d) which is greater than the penetration depth of the measuring frequency but small enough to damp eddy currents in the wall (21) produced by the time-varying inhomogeneous magnetic field to such an extent that the time-variant inhomogeneous magnetic field essentially can penetrate the wall (21).

21 Claims, 2 Drawing Sheets

APPARATUS TO EXCITE AND/OR TO DETECT MAGNETIC RESONANCE

FIELD OF THE INVENTION

The invention concerns a device to excite and/or detect magnetic resonance in samples in particular in the field of whole body tomography using a probehead incorporating a high frequency system to transmit and/or detect a high frequency magnetic field of a given measuring frequency as well as a coil system to produce a magnetic field of predetermined inhomogeneity varying according to a predetermined time variable program inside the probehead whereby elements of the high frequency system are combined with elements of the coil system to form a common construction unit and including a signal processing unit for measured resonance signals.

DESCRIPTION OF THE PRIOR ART

A device of the above mentioned kind is known from EP-A 0307981, corresponding to U.S. Pat. No. 4,893,083.

In exciting and measuring magnetic resonance the sample to be investigated is exposed to a constant magnetic field of predetermined strength as well as to a high frequency alternating field of predetermined frequency which is orthogonal to the constant magnetic field. If the ratio of this frequency to the strength of the constant homogeneous magnetic field corresponds to the so-called gyromagnetic ratio the magnetic dipoles inside the sample, e.g. particular nuclei or electrons, are in resonance. This is called nuclear magnetic resonance (NMR) or electron spin resonance (ESR).

It is also known in the art to add further so-called gradient fields to the homogeneous magnetic field. These are time-constant magnetic fields or magnetic fields which are constant at least for a short time with a predetermined spatial inhomogeneity. Such a gradient magnetic field can for example effect a linear increase or decrease in the magnetic field strength along the axis of the constant homogeneous magnetic field or along any other direction. The switching on or off these gradient fields according to a predetermined program is also known in the art.

By application of a plurality of such gradient fields it is possible to encode regions within the sample with respect to the magnetic field strength of this spatial region. Thus it becomes possible to measure isolated spatial regions of the sample individually, e.g. to take a spectrum at a particular location inside the sample or to create an image, e.g. the representation of a slice through a human body, by a sequence of a plurality of measurements. This may for example be effected by means of the so-called projection reconstruction method or by the 2d FT-method which are well known in the art.

With imaging methods it is necessary to effect the above mentioned encoding by switching the various gradient fields in rapid time sequence in order to create an image within tolerable time limits. Therefore in a practical measuring sequence the various gradient fields are switched on and off so that differently encoded signals can, in rapid time sequence, be detected in order to produce an image. From these signals an image is reconstructed by means of a computer.

In conventional NMR tomographs the constant homogeneous magnetic field is created by a solenoid coil, e.g. by means of a superconducting magnet system. In the inner bore of this coil there is a probehead. The design of this probehead depends mainly on the measuring frequency used. For relatively low frequences on the order of 10 MHz coils are preferred to transmit and/or to detect the magnetic high frequency field, whereas for considerably higher frequencies the so-called bird cage resonator is preferably used. This bird cage resonator consists of electrically conductive rods or bands which are individually tuned to resonance with the used measuring frequency by means of capacitors, said rods being, however, coupled via their stray fields and/or by other means so that they can be commonly excited in a desired mode of oscillation.

Further there must also be so-called gradient coils inside or around the probehead in order to create the gradient fields described above. Since for the reasons mentioned above a plurality of such gradient fields need to be created, a corresponding number, or a corresponding multiple of this number of individual gradient coils, is necessary. The various gradient coils are connected to gradient power supplies in order that they may be driven in a short time sequence by a predetermined current. This is effected by switching with a switching time which is as short as possible in order to be able to detect within a given measuring time a maximum number of measuring points or, expressed the other way round, to have the shortest possible measuring time for the total image for a predetermined number of measuring points. This is desirable because for larger cross sectional images there are artifacts if the patient, whose body is measured, is moving during the measuring time. To eliminate such motion artifacts one attempts to keep the measuring time as short as possible, i. e. to also correspondingly reduce the sampling time of the gradient coils. The gradient fields will therefore be called time-variant in the following although during the moment of measurement they may be constant for a short time.

On the other hand one has to consider that in such apparatusses a main cost factor is given by the magnet system to produce the constant and homogeneous magnetic field. The price of a magnet system suitable for tomography measurements depends inter alia considerably on its usable inner bore diameter. Within this inner bore diameter, housing the above mentioned probehead, the gradient coils must be placed, whereby in order to avoid eddy current effects, a certain distance from the inner tube wall of the magnet system must be maintained, e.g. from the inner wall of a dewar housing a superconducting magnet system.

The gradient coils on which during use considerable electrodynamic forces act, are generally fixed to a mechanically stable cylindrical tube made of electrically non-conducting material. Inside this tube, the system to create the high frequency exciting field must be housed and said system, on its part, must exhibit a certain distance to the gradient coils in order to reduce undesired couplings and losses. Therefore e.g. the above already mentioned bird cage resonator is in most cases equipped with a cylindrical metallic shielding which has to be separated from the electrically conductive rods or bands in order not to obstruct the formation of the high frequency magnetic field. For these reasons the cost determining inner bore of the magnet is reduced twice by distances at the expense of the effective measuring volume.

From the above mentioned EP-A0307981 a device to excite and/or to detect magnetic resonance is known using a conventional hollow cylindrical probehead the outside of which is restricted by a cylindrical tube.

Within the tube there is a set of gradient coils as well as a coil system to create a high frequency alternating field. The design is such that the gradient coils are multilayered radially and run essentially along the perimeter of the inner surface of the cylindrical tube whereas the coils to create the high frequency alternating field are fed through between the layers of the gradient coils and run essentially in an axial direction. The coil to create the high frequency alternating field exhibits several radial steps in order to be fed through the radial gaps of the gradient coils.

Because of this the known arrangement is extremely costly to produce and it is hardly conceivable that individual coils may be dismantled again e.g. for repair purposes. Moreover this known arrangement implies systematically that there are radial gaps between the gradient coils which enable that the coils to create the high frequency alternating field can be fed through. In addition in this arrangement undesired couplings between the various coils systems are to be expected.

BRIEF SUMMARY OF THE INVENTION

The purpose of the invention is to improve the apparatus mentioned at the beginning in order to create a common unit for the gradient coils and the system producing the high frequency alternating field which is simple, easy to assemble, and in particular space saving, while avoiding undesired couplings.

This purpose is achieved by the invention by forming the construction units as hollow bodies, whereby the coils of the coil system are located inside the hollow bodies and conductive outer walls of the hollow bodies form the high frequency system with wall thicknesses which are greater than the penetration depth of the measuring frequency but sufficiently small to damp the eddy currents inside the wall which are created by the time-varying inhomogeneous magnetic field to such an extent that the time-varying inhomogeneous magnetic field can largely penetrate the wall.

The purpose of the invention is in this way completely achieved.

The invention makes advantageously use of the fact that the frequency of the high frequency field on one side and the essential components of the frequency spectrum of the time-varying inhomogeneous magnetic field on the other side are different by several orders of magnitude. Because of this frequency separation the penetration depth of both frequences are different. Therefore it is possible to transmit the high frequency alternating currents with little electrical losses via the electrically conductive wall or coating of a hollow body which is suited to house the gradient coils while on the other hand the very much lower frequency components of the time-varying inhomogeneous magnetic field can penetrate the wall or coating, respectively, without any severe losses or distortions by eddy currents.

A detrimental influence of the gradient coils on the high frequency system cannot occur as long as these coils are housed completely inside the metallic walls or coating, respectively, of the hollow bodies. This condition has as a first consequence that capacitors for tuning the high frequency or other capacitances may only be located at one end of the hollow bodies. Secondly, for this reason, the gradient coils for production of the time-varying inhomogeneous magnetic field in the direction of the axes of the magnet system and of the probehead may not be located inside these hollow spaces but only those which are used to create inhomogeneities in radial direction. Thirdly the hollow bodies for housing the essentially flat gradient coil should be as wide as possible.

The invention has the additional advantage that the hollow bodies are construction units which are easy to handle and which can be pre-assembled and need only be inserted into the probehead.

The fact that the gradient coils for the inhomogeneous magnetic field varying along the axis may not be housed within the hollow bodies is no disadvantage. These coils may also be arranged axially in front of or behind the bird cage resonator, i. e. without extra space requirement in the important radial direction.

All this distinguishes the apparatus of the invention markedly from the known device of EP-A 0307981, mentioned at the beginning. In this device, on the one hand, the coils for production of the high frequency alternating field run radially outside of gradient coils. This has the consequence that inner gradient coils which are closer to the axis weaken the high frequency alternating field. On the other hand, this has the further consequence that a complicated structure is created which can only be inserted into the probehead as a whole. Therefore the structure is no longer accessible for exchange of individual elements.

In a preferred embodiment of the invention the probehead has an essentially hollow cylindrical shape and the hollow bodies extend in the inner space in axial direction.

A particularly good effect is achieved by distributing several, preferably four, hollow bodies evenly over the perimeter of the inner space.

This measure has the advantage that it forms a good compromise between a large number of axial conductors which is in general desirable and an arrangement which is mechanically simple to construct. The need to have the hollow bodies relatively flat in order to house flat extended gradient coils also calls for a reduction of the number of rods or bands compared to known embodiments of bird cage resonators, preferably to only four.

In a further preferred embodiment of the invention, the wall of the hollow body is coupled capacitively to a front side of the probehead. In particular the hollow body or an axial extension of the hollow body may extend into a correspondingly shaped pocket within the front end of the probehead. It is particularly preferred if in this case a gap between hollow body or extension, respectively, and pocket is filled with a dielectric material. In these cases a radial front surface of the wall can be coupled advantageously by a capacitor-like arrangement. In particular the capacitor-like arrangement may be dimensioned as a finetuning of the coupling.

The wide hollow bodies have a considerably smaller inductance compared to the thinner rods or bands of conventional bird cage resonators. This is no disadvantage as long as no relatively thin conductors are within the high frequency circuit. Therefore it is advantageous not to use conventional capacitors with wires or bands as for tuning but to use an embodiment with an extremely small inductance whereby the total perimeter of the hollow bodies serves as a feed conductor. This may be achieved as described by having an extension of the hollow bodies extending over the end surface of the resonator into pockets in this plane. By the insulating intermediate layers between the hollow bodies and the pockets a stable radial and tangential mounting of the free ends of the hollow bodies may be achieved. It is also possible to provide means for capacitive coupling of the system to a generator or an amplifier or means for finetuning of the individual resonators inside these pockets as described above.

In a further preferred embodiment of the invention the hollow bodies are driven by a high frequency current in such a way that in the inner space a circularly polarized high frequency alternating field is created.

As an alternative one can obviously also create a linearly polarized magnetic field.

These measures have the well-known advantage that magnetic resonance measurements with different polarizations (linear or circular) of the high frequency alternating field can be performed.

In preferred embodiments of the invention the coils are made of wire.

It is particularly preferred if the coils are cast inside the hollow body. In particular the coils inside the hollow body may be cast with a sound absorbing sealing compound.

This has the advantage that the gradient coils which are preferably made of wire can be prefabricated in a way that they are easily introduced into the hollow bodies. If the gradient coils are cast inside the hollow body in the way described, not only a good mechanical securing of the coils inside the hollow body is effected but this measure also contributes to a reduction of the very strong and very disturbing noise which is created during the switching of the coil currents inside the strong homogeneous magnetic field.

The last mentioned effect may be improved in the manner described by using a sound absorbing sealing compound. This is also advantageous because the essential components of the frequency spectrum of the current driving the gradient coils is within the audible range. Sensitive patients which are partly already under psychological stress due to claustrophobia are therefore in conventional devices occasionally strongly disturbed by the intense and also largely non-harmonic noise. Reducing this noise by sound absorbing sealing compound also strongly reduces such irritations of sensitive patients.

In a further preferred version of the invention the hollow body is secured within the inner space by means of a securing ring.

This measure has the advantage that a stable securing inside the inner space of the probehead is achieved also outside of possibly present axial extensions.

Further embodiments of the invention are characterized by slots in the walls of the hollow bodies.

In this way it is advantageously possible to additionally reduce the detrimental influence of eddy currents on the formation of the time-varying inhomogeneous magnetic field. In hollow bodies extending axially inside the probehead the walls or coatings, respectively, are preferably axially slotted in the axial region and are preferably radially slotted in the radial front surface.

Finally, one embodiment of the invention is particularly preferred where a signal processing unit employs a compensating stage to compensate non-linearities of the gradient fields caused by the design of the coils, in particular in relation to imaging methods.

If the hollow bodies according to the invention are used, it may sometimes occur that the possible width of the gradient coil is not sufficient to provide a linearity of the inhomogeneity of the magnetic field which would be comparable to that obtainable in the embodiments described in the beginning with gradient coils which are arranged on a hollow cylinder. This leads to geometrical distortions of the image obtained by processing the measuring results with a data processing unit. It is possible, however, to compensate these distortions within the compensating stage by software which is adapted to the gradient coil used.

Other advantages of the invention will become apparent from the specification and the drawings.

It goes without saying that the features that have been described above and will be explained hereafter can be used not only in the described combinations but also in any other combination or individually without leaving the scope of the present invention.

BRIEF DESCRIPTION OF THE DRAWINGS

An embodiment of the invention is shown in the drawings and will be described in greater detail in the following specification. It is shown in.

DETAILED DESCRIPTION OF THE PREFERRED EMBODIMENTS

Figure 1:
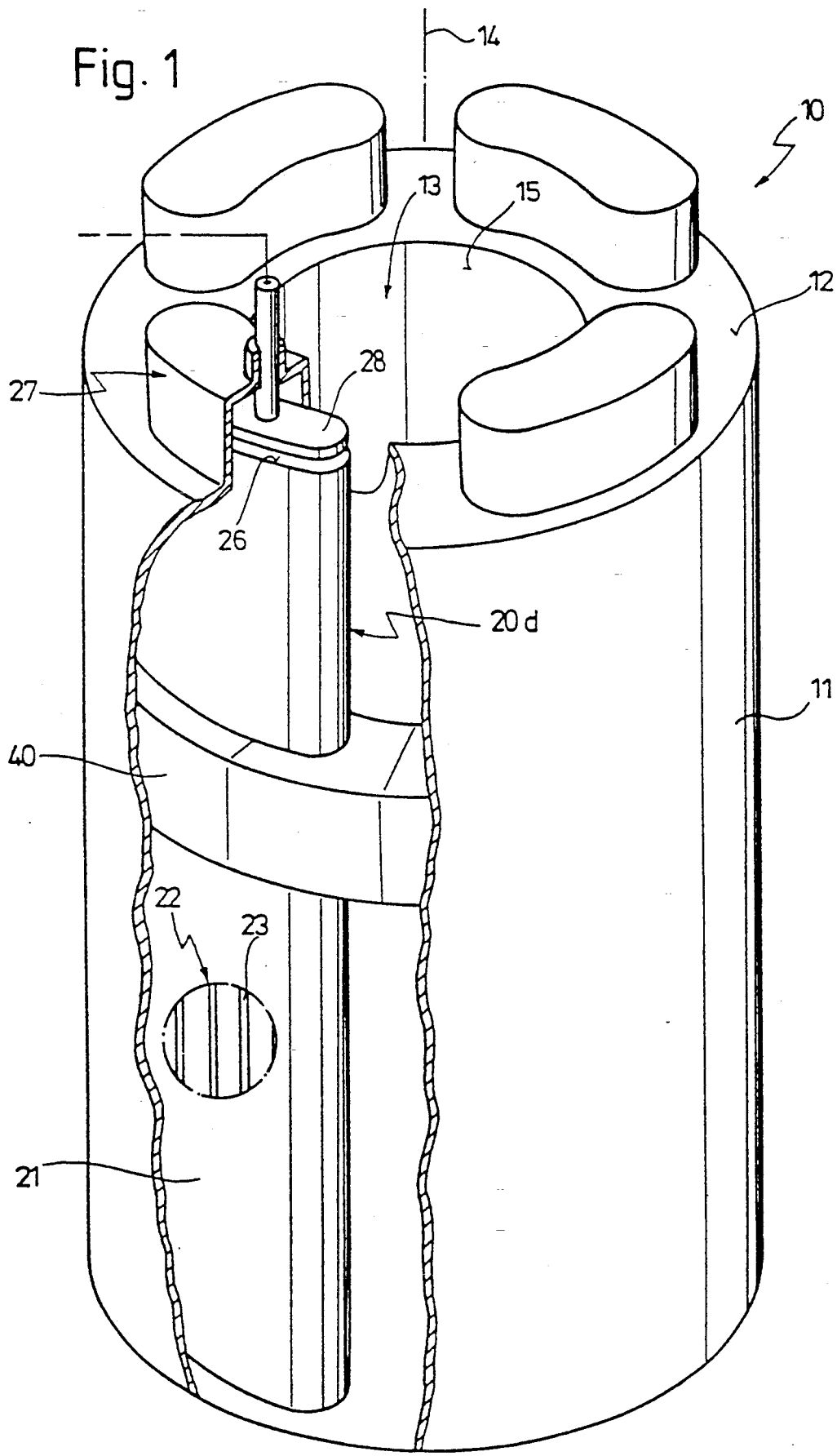
FIG. 1 A schematic view in perspective of a probehead for an apparatus according to the invention, partly cut open.
Figure 2:
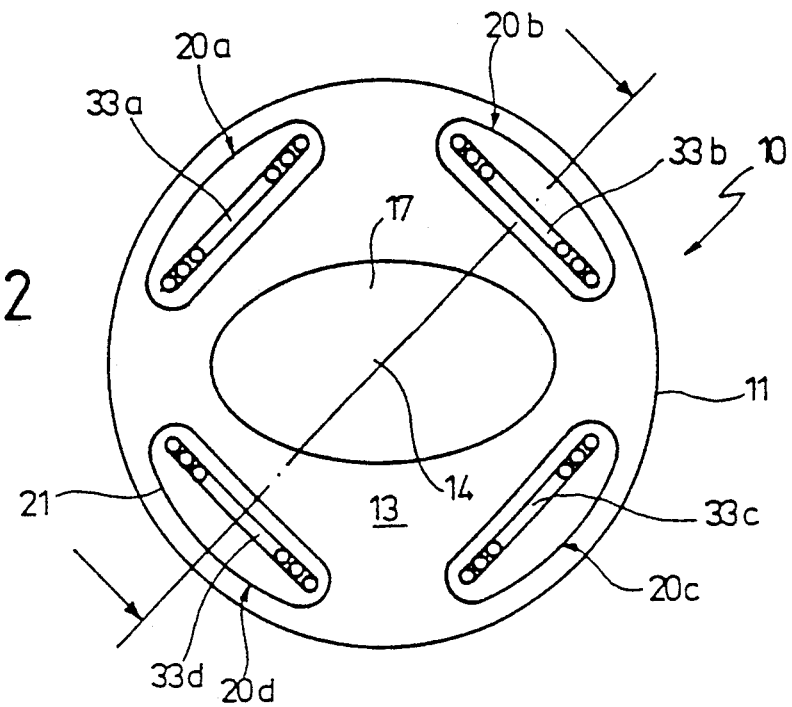
FIG. 2 A radial cross section of the probehead of FIG. 1.

In the FIGS. 10 indicates, in its totality, a probehead as can be used in an apparatus according to the invention to excite and to measure magnetic resonance in samples. As an example the invention will in the following be described with respect to a whole body NMR tomograph. However, the invention is not limited to this application.

Probehead 10 employs a cylindrical housing 11 with front sides 12 extending in a radial direction. The cylindrical housing with the front sides 12 encloses an inner space 13 which is therefore distributed symmetrically around an axis 14. In the probehead 10 there may be an inner wall 15, which can be shaped cylindrically, elliptically or otherwise and which serves to separate a sample 17 from the coil systems. Sample 17 represents in the present description of an embodiment a human body which is situated inside probehead 10 either completely or partly in the direction of axis 14.

The diameter of the housing can be chosen such that the housing may be inserted into a magnet system in a tight fit.

In the inner space 13 one recognizes four hollow bodies 20a,20b,20c and 20d, which are evenly distributed over an inner perimeter of the probehead 10 and which extend in axial direction, i. e. parallel to axis 14.

The hollow bodies 20 exhibit an electrically conducting wall 21 or any other wall with a electrically conducting coating, for example a wall made from glass fiber reinforced plastic covered with copper or the like. The thickness of the electrically conducting wall or coating is indicated as d in FIG. 3. For the calculation of the thickness d the following is valid:

Acounting for the measurement frequency used of e.g. 100 to 300 MHz, and the electrical conductivity of the wall or coating 21, a penetration depth may be obtained from well-known tables. Firstly, the thickness d must be larger than this penetration depth of the measuring frequency. This yields a lower limit for the thickness d. On the other hand, the thickness d must also be relatively small to damp eddy currents in the wall or coating 21 which are created by the switched, i. e. time-variant, inhomogeneous magnetic fields. Depending on the frequency range covered by the essential components of the frequency spectrum of the eddy currents induced by the gradient fields, one can therefore determine an upper limit for the thickness d.

As can be seen from FIG. 1 in a strongly enlarged partial view 22 of the wall 21, the wall 21 exhibits slots 23 extending in axial direction around the wall of the hollow bodies 20, whereas they run in a radial direction on the radial front surfaces which will be further discussed below.

Figure 3:
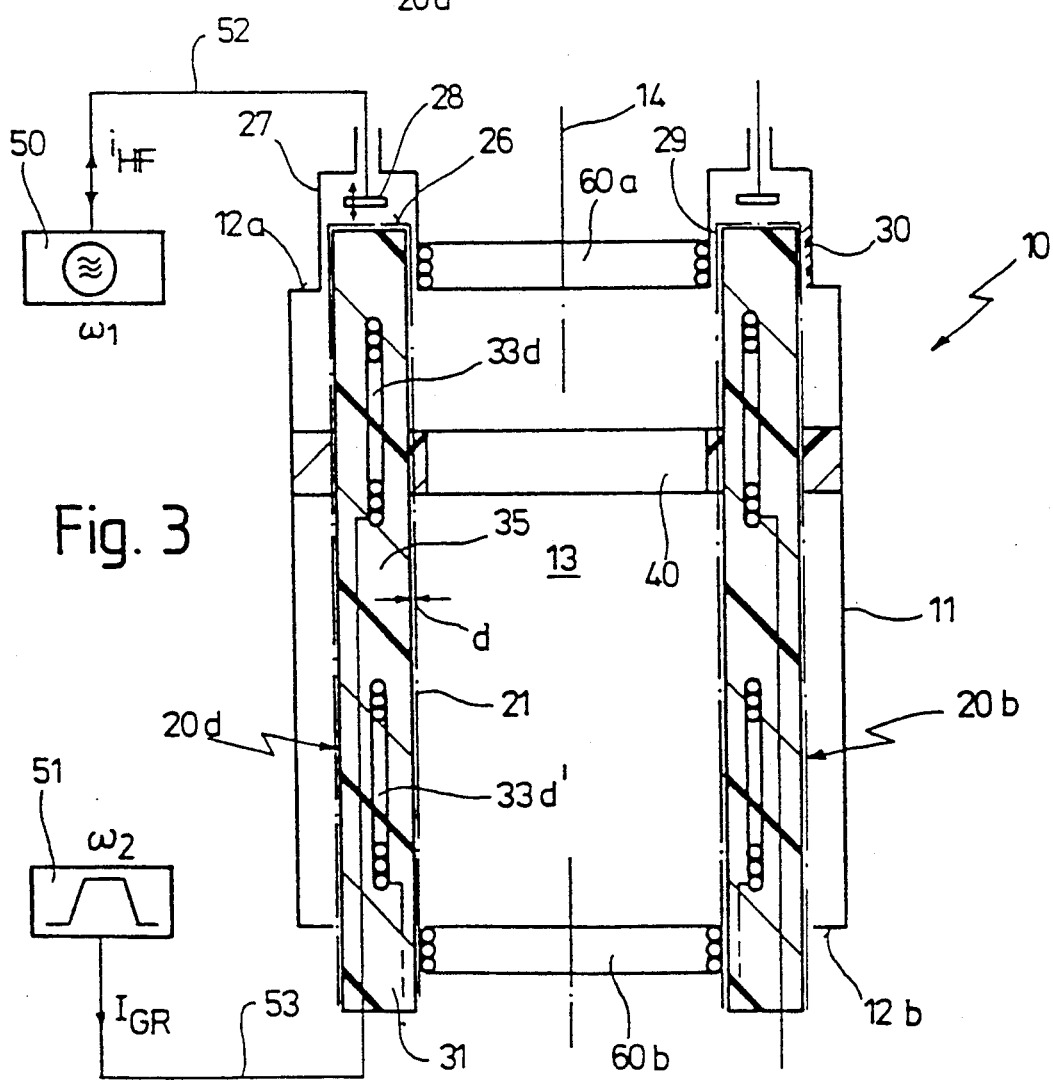
FIG. 3 An axial cross section of the probehead according to FIG. 1.

The hollow bodies 20a to 20d extend preferably with their entire cross section over the upper front side 12a of the probehead and extend into appropriately formed pockets 27 which are shaped to the upper front side 12a of the probehead 10, leaving only a small gap. Inside the pockets 27, plates 28 are located in an axial distance from the front sides 26, said plates being adjustable in an axial direction, as indicated in FIG. 3, by a double arrow. The plates 28 are connected to a high frequency current supply, as explained further below.

A gap 29 between the hollow bodies 20a to 20d and the pockets 27 represents a capacitor of low inductance, which is used to tune the hollow bodies 20a to 20d to resonance. This gap 29 preferably contains a voltage breakdown-proof dielectric material 30, increasing the voltage stability and also the capacitance for a given gap 29. In addition, a mechanical support of the upper end of the hollow bodies 20a to 20d is achieved.

At the lower end of the probehead 10 the electrically conducting walls 21 of the hollow bodies 20a to 20d or their coating or metallic cover, respectively, is conductively connected over the entire perimeter to one lower front side 12b. In addition there may be extensions 31 of arbitrary shape in order to introduce leads for gradient coils 33a, 33b, 33c and 33d.

The gradient coils 33a to 33d are located inside the hollow bodies 20a to 20d. The gradient coils 33a to 33d each form pairs inside every hollow body 20a to 20d, as indicated in FIG. 3 as 33d and 33d'.

A sealing compound 35 serves to fix the gradient coils 33a to 33d, whereby the gradient coils 33a to 33d are cast in the hollow bodies 20a to 20d by means of the sealing compound 35. The sealing compound 35 is preferably sound absorbing, so that oscillations in the audible range are absorbed which are created by the gradient coils 33a to 33d during switching of the gradient fields.

A ring 40 or several of such rings, are arranged in a radial plane of the probehead 10 to secure the hollow bodies 20a to 20d radially.

In order to use the probehead 10, the apparatus according to the invention incorporates inter alia a high frequency transmitter/detector 50. The high frequency transmitter/detector 50 provides a high frequency current $i_{HF}$, being fed to plates 28 via a high frequency cable 52.

On the other hand, the apparatus according to the invention incorporates also one or more gradient power supplies 51, only one of which is represented in FIG. 3. The gradient power supply 51 produces a gradient current $i_{GR}$, being a DC current. Each gradient current, however, is switched on only for a short time period according to a predetermined sequence of the magnitude of the current. After this, a different current, possibly also into different gradient coils, can be set.

The gradient coils 33a to 33d or a plurality of such gradient coils are driven by the gradient power supply 51 via current cable 53 in such a way that in the inner space 13 gradient fields of predetermined inhomogeneity are present or add to the effective basic field.

In using the probehead 10 the high frequency transmitter/detector 50 is switched on and supplies a high frequency current $i_{HF}$ via the high frequency cable 52 to plate 28. This plate is axially adjusted so that an optimum coupling via the plate capacitor 28/26 to the hollow bodies 20a to 20d is achieved. These act as axial conductors and together form a high frequency coil. This high frequency coil produces a high frequency alternating field in the inner space 13 which is essentially directed perpendicular to axis 14. The high frequency alternating field may be either linearly or circularly polarized by suitable adjustment of the phase at the several hollow bodies 20a to 20d.

It is understood that the high frequency current $i_{HF}$ is in general not a constant high frequency current but is also switched in order to allow for pulsed nuclear magnetic resonance measurements. However, this is well-known in the art and shall not be explained again within the framework of the present invention. The same is true for the detection of the nuclear resonance signals, which may either be detected and measured with the same or with a separate high frequency system.

In the embodiments shown, the gradient coil pairs 33a or 33a' and 33c or 33c', respectively, which are diametrically facing each other serve e.g. as x gradient, whereas the two other gradient coil pairs 33b and 33b' also facing each other diametrically, form the y gradient. The gradient coils for the z gradient cannot be provided for inside the hollow bodies 20a to 20d of the embodiment shown, they are therefore attached to the front sides and are designated as 60a, 60b in FIG. 3.

I claim:

1. Apparatus to excite and detect magnetic resonance, the apparatus having a hollow probehead with an interior space and employing high frequency system elements to create and detect a high frequency magnetic field of a predetermined frequency in the interior space as well as gradient coils to create a magnetic field of predetermined inhomogeneity in the interior space and in which the high frequency system elements are combined with the gradient coils to form an integrated structure, characterized in that the integrated structure comprises a plurality of hollow tubular elements, each of the plurality of tubular elements having conductive walls, the tubular elements containing the gradient coils and the conductive walls forming the high frequency system elements.

2. Apparatus according to claim 1 characterized in that the probehead has essentially the shape of a hollow cylinder with an axis and that each of the plurality of hollow tubular elements extends inside the interior space parallel to the axis.

3. Apparatus according to claim 1 characterized in that the interior space has a perimeter and the plurality of hollow tubular elements are evenly distributed over the perimeter.

4. Apparatus according to claim 3 characterized in that the plurality of hollow tubular elements comprises four hollow tubular elements which are evenly distributed over the perimeter.

5. Apparatus according to claim 1 characterized in that the probehead comprises a hollow tubular probehead body and an end cap and the conductive walls of the hollow tubular elements are physically positioned with respect to the end cap so that the conductive walls couple capacitively to the end cap.

6. Apparatus according to claim 5 characterized in that the end cap comprises a plurality of pockets and a portion of each of the hollow tubular elements extends into one of the plurality of pockets.

7. Apparatus according to claim 6 characterized in that each of the plurality of pockets comprises a hollow pocket wall and a pocket end cap and the portion of each of the hollow tubular elements which extends into one of the plurality of pockets extends sufficiently close to the pocket wall to form a gap and the gaps are filled with a dielectric material.

8. Apparatus according to claim 5 characterized in that each of the hollow tubular elements further comprises a tubular element end cap positioned with respect to the probehead end cap so that the tubular element end caps are capacitively coupled to the probehead end cap.

9. Apparatus according to claim 8 characterized in that the end cap comprises a plurality of pockets, each of the plurality of pockets comprising a hollow pocket wall and a movable pocket end cap and the pocket end cap is positioned with respect to one of the tubular element end caps so that the pocket end cap forms a capacitor with a value with one of the plurality of tubular element end caps and the pocket end cap can be moved to adjust the capacitor value.

10. Apparatus according to claim 3 characterized in that the apparatus further comprises a high frequency generator for generating phase-shifted high frequency currents, the high frequency generator being connected to the plurality of hollow tubular elements in such a way that a circularly polarized high frequency magnetic field is created in the interior space.

11. Apparatus according to claim 1 characterized in that the gradient coils are potted inside the hollow tubular elements.

12. Apparatus according to claim 1 characterized in that the conductive walls are comprised of an electrically conductive coating on a support material.

13. Apparatus to excite and detect magnetic resonance, the apparatus having a hollow probehead with an interior space and employing high frequency system elements to create and detect a high frequency magnetic field of a predetermined frequency in the interior space as well as gradient coils to create a time-variant magnetic field of predetermined inhomogeneity in the interior space and in which the high frequency system elements are combined with the gradient coils to form an integrated structure, characterized in that the integrated structure comprises a plurality of hollow tubular elements, each of the plurality of tubular elements having conductive walls, the tubular elements containing the gradient coils and in that the conductive walls form the high frequency system elements and have a thickness which is greater than the penetration depth of the high frequency magnetic field and is sufficiently small that eddy currents created in the conductive walls by the time-variant magnetic field are damped to such an extent that the time-variant magnetic field essentially penetrated the conductive walls.

14. Apparatus according to claim 13 characterized in that the probehead has essentially the shape of a hollow cylinder with an axis, the interior space has a perimeter, and the plurality of hollow tubular elements comprises four hollow tubular elements which extend inside the interior space parallel to the axis and are evenly distributed over the perimeter of the interior space.

15. Apparatus according to claim 13 characterized in that the probehead comprises a hollow tubular probehead body and an end cap and the conductive walls of the hollow tubular elements are physically positioned with respect to the end cap so that the conductive walls couple capacitively to the end cap.

16. Apparatus according to claim 13 characterized in that the probehead comprises a hollow tubular probehead body and an end cap with a plurality of pockets and a portion of each of the hollow tubular elements extends into one of the plurality of pockets.

17. Apparatus according to claim 13 characterized in that the conductive walls are slotted.

18. Apparatus according to claim 13 characterized in that the apparatus further comprises a support ring and the hollow tubular elements are supported inside the interior space by means of the support ring.

19. Apparatus to excite and detect magnetic resonance inside an MRI tomograph, the apparatus having a hollow probehead with an interior space and employing high frequency system elements to create and detect a high frequency magnetic field of a predetermined frequency in the interior space as well as gradient coils to create a time-variant magnetic field of predetermined spatial inhomogeneity in the interior space, the time-variant magnetic field varying according to a predetermined time-sequence, in which the high frequency system elements are combined with the gradient coils to form an integrated structure, the apparatus further having a signal processing unit for processing measured resonance signals characterized in that the integrated structure comprises a plurality of hollow tubular elements having electrically conducting outer walls and containing the gradient coils and that the electrically conducting outer walls form the high frequency system elements and have a thickness which is greater than the penetration depth of the high frequency magnetic field and is sufficiently small that eddy currents created in the conductive walls by the time-variant magnetic field are damped to such an extent that the time-variant magnetic field essentially penetrates the conductive walls.

20. Apparatus according to claim 19 characterized in that the gradient coils are potted inside the hollow tubular members by means of a sound absorbing potting compound.

21. Apparatus according to claim 19 characterized in that the signal processing unit, in order to create an image, comprises a compensation stage to compensate for non-linearities of the time-variant magnetic field arising from the design of the gradient coils.

* * * * *